United States Patent
Fogal et al.

[11] Patent Number: 6,117,693
[45] Date of Patent: Sep. 12, 2000

[54] SYSTEM FOR FABRICATING AND TESTING ASSEMBLIES CONTAINING WIRE BONDED SEMICONDUCTOR DICE

[75] Inventors: Rich Fogal; Steve Heppler, both of Boise, Id.

[73] Assignee: Micron Technology, Inc., Boise, Id.

[21] Appl. No.: 09/193,900

[22] Filed: Nov. 18, 1998

Related U.S. Application Data

[62] Division of application No. 08/059,245, Apr. 13, 1998, Pat. No. 5,918,107.

[51] Int. Cl.$^7$ .................................................. H01L 21/66
[52] U.S. Cl. .......................... 438/14; 438/15; 228/180.5; 324/765
[58] Field of Search ................... 438/14, 15, 10, 438/617; 324/754, 755, 765; 228/180.5; 73/827

[56] References Cited

U.S. PATENT DOCUMENTS

| | | | |
|---|---|---|---|
| 5,153,507 | 10/1992 | Fong et al. | 324/158 R |
| 5,279,975 | 1/1994 | Devereaux et al. . | |
| 5,391,892 | 2/1995 | Devereaux et al. | 257/48 |
| 5,420,520 | 5/1995 | Anschel et al. . | |
| 5,457,400 | 10/1995 | Ahmad et al. . | |
| 5,483,175 | 1/1996 | Ahmad et al. . | |
| 5,514,912 | 5/1996 | Ogashiwa | 257/784 |
| 5,591,920 | 1/1997 | Price et al. | 73/828 |
| 5,657,284 | 8/1997 | Beffa . | |
| 5,679,609 | 10/1997 | Aimi et al. . | |
| 5,680,344 | 10/1997 | Seyyedy . | |
| 5,684,809 | 11/1997 | Stave et al. . | |
| 5,716,218 | 2/1998 | Farnworth et al. | 438/15 |
| 5,721,496 | 2/1998 | Farnworth et al. . | |
| 5,757,820 | 5/1998 | Angelotti . | |
| 5,847,445 | 12/1998 | Wark et al. . | |
| 5,894,981 | 4/1999 | Kelly | 228/180.5 |
| 5,915,977 | 6/1999 | Hembree et al. . | |
| 5,918,107 | 6/1999 | Fogal et al. . | |

*Primary Examiner*—Kevin M. Picardat
*Attorney, Agent, or Firm*—Stephen A. Gratton

[57] ABSTRACT

A method and system for fabricating electronic assemblies, such as multi chip modules, which include wire bonded semiconductor dice, are provided. Initially, dice having bond pads, and a substrate having corresponding bond pads, are provided. Using a wire bonding process, bonded connections are made between the bond pads on the dice, and the bond pads on the substrate. During the wire bonding process, electrical continuity in the bonded connections can be evaluated. Following wire bonding, but prior to subsequent processing of the assemblies, quick functionality tests can be performed to evaluate other electrical characteristics of the assemblies (e.g., gross functionality, open/short, pad leakage, cell defects). This permits defective assemblies to be identified prior to further processing. Once the assemblies have been completed, full functionality and parametric tests can be performed. An assembly for performing the method includes a conventional wire bonder; a tester having test circuitry for performing the required tests; and an electrical connector for establishing temporary electrical communication with the assembly.

18 Claims, 3 Drawing Sheets

SYSTEM FOR FABRICATING AND TESTING ASSEMBLIES CONTAINING WIRE BONDED SEMICONDUCTOR DICE

CROSS REFERENCE TO RELATED APPLICATIONS

This application is a division of application Ser. No. 08/059,245 filed Apr. 13, 1998, now U.S. Pat. No. 5,918,107.

FIELD OF THE INVENTION

This invention relates generally to semiconductor manufacture. More particularly, this invention relates to an improved method and system for fabricating and testing electronic assemblies that include semiconductor dice wire bonded to substrates.

BACKGROUND OF THE INVENTION

In the fabrication of electronic assemblies, semiconductor dice are sometimes wire bonded to substrates. For example, multi chip modules, such as memory modules (e.g., SIMMs, DIMMs), can include multiple bare dice wire bonded to a substrate. Typically, the substrates comprise an electrically insulating material, such as ceramic or FR-4. The substrates can also include conductors (e.g., metal traces) which electrically interconnect the dice.

The wire bonds electrically connect bond pads on the dice to corresponding bond pads on the conductors. With some assemblies, the dice and wire bonds are subsequently encapsulated in a plastic resin. Repair sites are also sometimes included on the substrates for mounting replacement dice for defective dice.

With this type of electronic assembly, the substrates can also include edge connectors in electrical communication with the conductors on the substrate. The edge connectors allow electrical paths to be made from the outside to the dice. For example, an edge connector on a substrate can be configured for electrical engagement with a mating electrical connector of a computer or other electronic device.

In order to test the electrical characteristics of an electronic assembly, and the dice contained on the assembly, standard tests can be performed. In the past, these tests have been performed on the completed assembly by applying test signals through the substrate edge connectors. For example, tests can be used to identify electrical defects in the assembly such as opens, shorts and high resistance.

The dice on the assembly can also be functionally tested to evaluate their individual electrical characteristics, and to evaluate the electrical characteristics of the assembly as a whole. For functionally testing the dice, test signals can be written to selected address and input/output ports for the assembly. The resultant signals can then be read to determine if the read data matches predetermined parameters. Substandard or defective dice can then be identified and replaced as required.

One shortcoming of this approach is that the defects are detected only after the assembly has been completed, and the dice and wire bonds have been encapsulated. It would be advantageous to provide a test procedure in which defects can be identified prior to completion of the assembly. This would permit defective components to be identified prior to incurring the time and expense of completing the assemblies.

The present invention is directed to a method and system for fabricating and testing electronic assemblies that include semiconductor dice wire bonded to substrates. The method includes testing prior to completion of the assembly, so that defective components can be identified early in the manufacturing process, before full manufacturing expenses are incurred.

SUMMARY OF THE INVENTION

In accordance with the present invention, an improved method and system for fabricating and testing an electronic assembly that includes wire bonded semiconductor dice, are provided. The method includes providing a substrate and one or more semiconductor dice, and then wire bonding the dice to the substrate. The dice and assembly are then tested during or following wire bonding, but prior to further processing of the assembly.

In an illustrative embodiment, the method is used to fabricate a multi chip module. Initially, the dice are placed on the substrate and wire bonded connections formed between bond pads on the dice, and corresponding bond pads on the substrate. As the wire bonded connections are being formed, continuity tests can be performed to verify continuity of the connections. Once the bonded connections have been formed, gross functionality tests can be performed by transmitting test signals through the substrate to the dice. Still further, other functionality tests can be performed on the assembly, and on the semiconductor dice contained on the assembly. The functionality tests can include open/short tests, pad leakage tests, and tests for cell defects.

Once the functionality tests have been performed, the assemblies that have been certified as being good, can be further processed (e.g., encapsulated). Assemblies containing electrical defects, or defective dice, can thus be identified prior to further processing. In addition, defective assemblies can be reworked and re-tested prior to further processing. Following completion of the assemblies, full functionality and parametric tests can be performed on the dice and assemblies.

A system for performing the method includes a wire bonder for wire bonding the dice to the substrate, a tester for testing electrical characteristics of the dice and assemblies, and an electrical connector for establishing electrical communication between the dice and tester. The tester can include circuitry for performing continuity, gross functionality and other test procedures. The electrical connector for the tester can be configured to electrically contact the edge connector on the substrate, or other test points on the substrate, to provide separate electrical paths for performing the electrical tests. The system can also include a controller for controlling further processing of the assembly responsive to the test data.

DETAILED DESCRIPTION OF THE PREFERRED EMBODIMENTS

Figure 1:
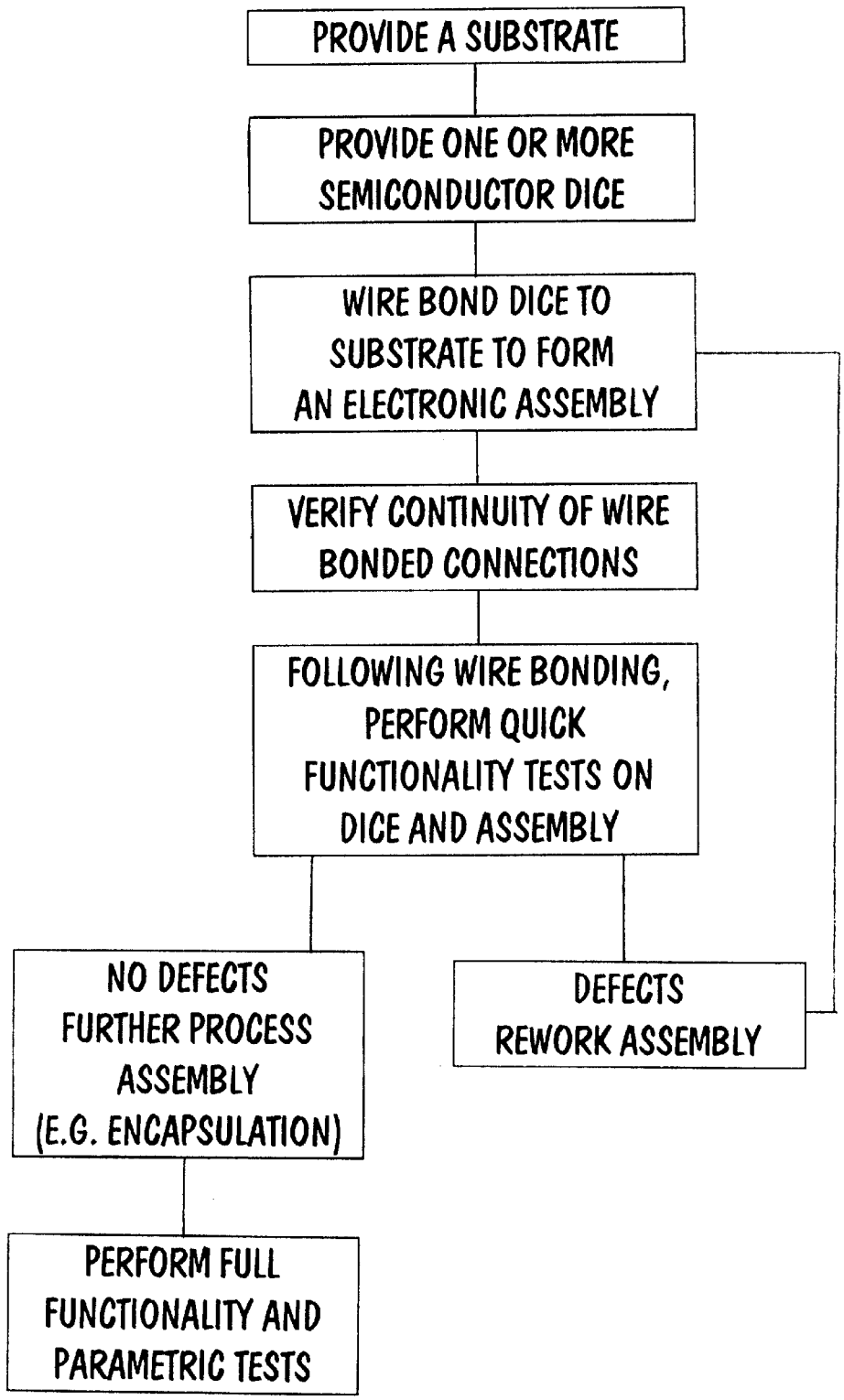
FIG. 1 is a block diagram illustrating steps in a method performed in accordance with the invention for fabricating and testing electronic assemblies.
Figure 2:
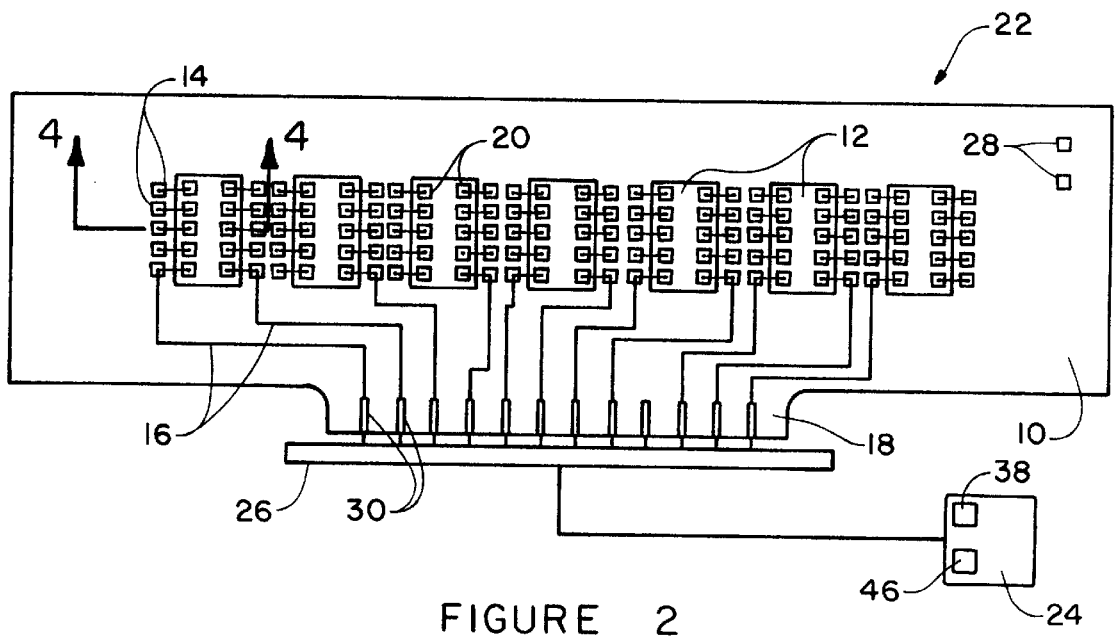
FIG. 2 is a schematic plan view of an electronic assembly during fabrication and testing in accordance with the above method.

Referring to FIGS. 1 and 2, a method for fabricating and testing electronic assemblies is illustrated.

Initially, a substrate 10 is provided. The substrate 10 comprises a rigid material such as a ceramic, a glass filled resin (e.g., FR-4), or silicon. As shown in FIG. 2, the substrate 10 includes multiple patterns of bond pads 14. The substrate 10 also includes patterns of conductors 16 in electrical communication with the bond pads 14, and an edge connector 18 in electrical communication with the conductors 16. For simplicity only a few conductors 16 are illustrated. However, each bond pad 14 can be in electrical communication with a corresponding conductor 16.

In addition to the substrate 10, one or more semiconductor dice 12 are provided. The dice 12 include patterns of bond pads 20 in electrical communication with integrated circuits contained on the dice 12. In the illustrative embodiment, the dice 12 comprise bare dice, and the bond pads 20 are generally planar metal pads formed on face portions of the dice 12. However, the dice 12 can also be contained in chip scale packages. In addition, the bond pads 20 can be contained on substrates mounted to the dice 12 and can be bumped rather than planar structures.

Following providing of the substrate 10 and dice 12, the dice 12 can be wire bonded to the substrate 10 to form an electronic assembly 22. In FIG. 2, the assembly 22 is illustrated following the wire bonding process but prior to completion of the assembly 22. In the illustrative embodiment, the assembly 22 comprises a multi chip module. If the dice 12 are provided as memory devices, the assembly 22 can be configured as a memory module, such as a single in line memory module (SIMM), or a dual in line memory module (DIMM). However, the method of the invention can be used to fabricate any type of electronic assembly that includes one or more semiconductor dice wire bonded to a substrate.

Prior to the wire bonding process, electrical connections are made between the edge connector 18 on the substrate 10, and a tester 24. The tester 24 includes an electrical connector 26 for making the electrical connections with the edge connector 18. The edge connector 18 includes contact pads 30 configured for electrical communication with corresponding electrical members (not shown) of the electrical connector 26. In the embodiment illustrated in FIG. 2, the electrical connector 26 is in the configuration of a male or female socket adapted to electrically engage the contact pads 30.

Figure 3A:
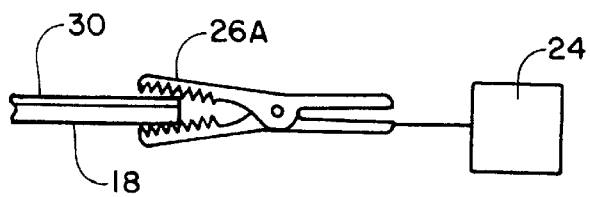
FIG. 3A is a side elevation view of an alternate embodiment electrical connection between the assembly and a tester.
Figure 3B:
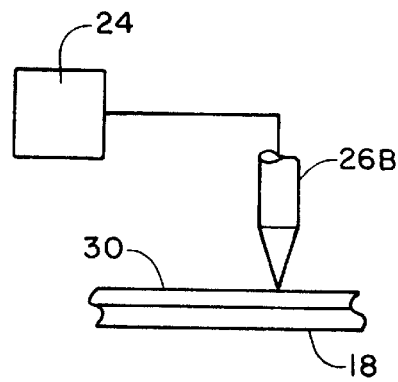
FIG. 3B is a side elevation view of another alternate embodiment electrical connection between the assembly and a tester.

As shown in FIG. 3A, an alternate embodiment electrical connector comprises electrical clips 26A. The electrical clips 26A clip to the contact pads 30 on the edge connector 18 to provide electrical paths between the dice 12 and the tester 24. As shown in FIG. 3B, another alternate embodiment comprises spring loaded electrical connectors 26B, such as "POGO PINS" manufactured by Pogo Industries, Kansas City, Kans. The spring loaded electrical connectors 26B can electrically engage the contact pads 30 on the edge connector 18 to provide electrical paths between the dice 12 and the tester 24. Alternately, the spring loaded electrical connectors 26B can be configured to electrically engage dedicated test pads 28 (FIG. 2) on the substrate 10. The test pads 28 are in electrical communication with the bond pads 14 and with the integrated circuits contained on the dice 12.

Figure 4:
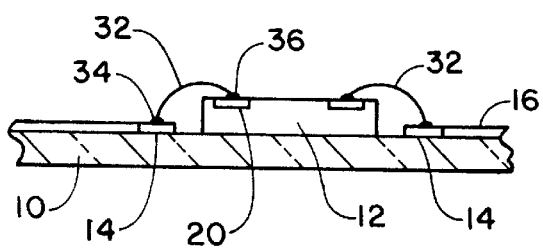
FIG. 4 is a cross sectional view taken along section line 4—4 of FIG. 2.

As shown in FIG. 4, during the wire bonding process, wires 32 are bonded to the bond pads 14 on the substrate 10, and to the bond pads 20 on the dice 12. The wires 32 include first bonded connections 34 to the bond pads 14 on the substrate 10, and second bonded connections 36 to the bond pads 20 on the dice 12. The bonded connections 34, 36 can be formed by conventional thermocompression, thermosonic, ultrasonic or wedge bonding techniques.

Figure 5A:
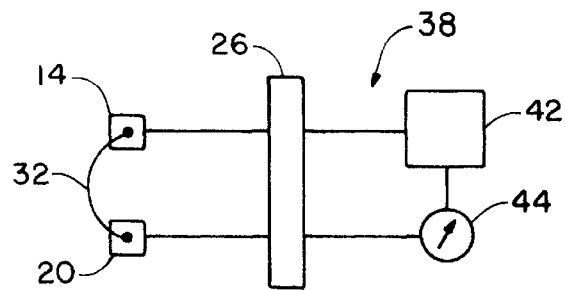
FIG. 5A is an electrical schematic of a circuit configured to measure continuity in wire bonded connections between the dice and a substrate of the assembly.

With the bond pads 14 on the substrate 10 in electrical communication with the electrical connector 26 and tester 24, the continuity of the bonded connections 34, 36 can be verified during (or shortly after) the wire bonding process. The tester 24 can include continuity circuitry 38 (FIG. 2) for performing the continuity tests. As shown in FIG. 5A, the continuity circuitry 38 can include a current source 42 adapted to apply electrical current through the electrical connector 26 to selected bond pads 14 on the substrate 10. The continuity circuitry 38 can also include a current measuring device 44, adapted to measure the resultant current through selected bond pads 20 on the dice 12. The continuity circuitry 38 can be used to detect defective bonded connections 34, 36. Assemblies 22 (FIG. 2) containing defective bonded connections 34, 36 can be removed from the fabrication process and re-worked as required.

Referring again to FIG. 2, the tester 24 can also include test circuitry 46 for "quick testing" various electrical characteristics of the dice 12. One electrical characteristic that can be evaluated is the "gross functionality" of each die 12. Such a test includes powering up an individual die 12 and then performing write, modify, or read operations on each of the data paths (i.e., DQs) into and out of the die 12. For example, in the case of a 4X die, zeros can be written to each of the four DQ's (four memory cells) and read. Next, the zeros can be changed to "1s" and checked to confirm the change has occurred. If the change occurs, the die is referred to as "grossly" functional.

As another example, the test circuitry 46 can be configured to detect cell to cell defects in dice 12 that contain memory cells. To detect cell to cell defects, high voltage values (logical "1") can be written to selected memory cells of an individual die 12. At the same time low voltage values (logical "0") can be written to adjacent memory cells. The test circuitry 46 then determines whether the adjacent memory cells maintain a logical "0" value. If not, then the logical "1" value written to the selected memory cells has shorted indicating a cell defect.

Another test that can be performed using the test circuitry 46 (FIG. 2) is known as a "Walking 1" test. With a "Walking 1" test, an entire array on a die 12 is set to zeros and a "1" is written to the first address. The "1" is then read. As a next step, the entire array is set to zeros, a "1" is written to the second address, and then read. This procedure is repeated through all of the addresses of the array.

The test circuitry 46 can also be configured to test for opens, shorts, and current leakage between the bond pads 20 on a die 12. Opens and shorts can be detected using a continuity circuit substantially as previously described, but configured to test for opens and shorts between selected bond pads 20 on the die 12.

Figure 5B:
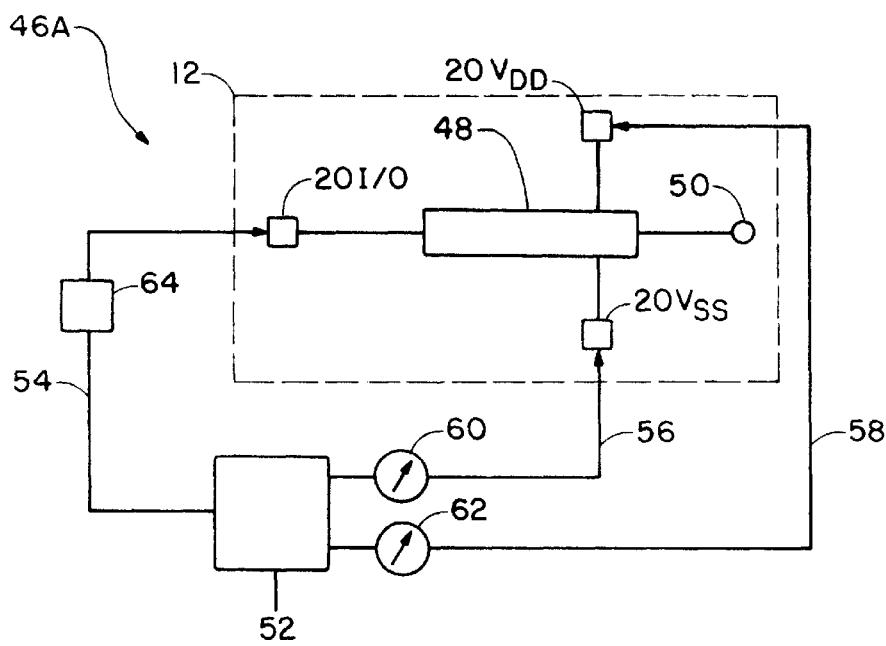
FIG. 5B is an electrical schematic of a leak checking circuit configured to measure leakage current from bond pads on the dice.

Referring to FIG. 5B, an exemplary leak checking circuit 46A is illustrated. The leak checking circuit 46A is adapted to test each die 12 for leakage current from the bond pads 20 on the die 12. As used herein, "leakage current" denotes an undesirable electrical path from a pad of a die (e.g., input/output pad) to the silicon substrate of the die, to a second pad of the die (e.g., power pad, ground pad, DC bias pad), or to another component of the die. Leakage current, for example, can result from a defective or damaged ESD circuit or other defective or damaged electrical components on the die 12. FIG. 5C illustrates the method of the invention in connection with an ESD circuit 48 on the die 12. However, the ESD circuit 48 is only one example of an electrical circuit on the die 12 that can cause leakage current through a bond pad 20.

In FIG. 5B, the ESD circuit 48 is located between an input/output pad 20I/O for the die 12 and the gate elements 50 for transistors formed on the die 12. The ESD circuit 48 is adapted to provide an electrical path to the ground pad $20V_{SS}$ or to the DC bias pad $20V_{DD}$ should an ESD voltage be applied to the input/output pad 20I/O.

As shown in FIG. 5B, the leak checking circuit 46A includes a power supply 52 and a conductive line 54 that is in electrical communication with the input/output pad 20I/O on the die 12. The power supply 52 is preferably a constant current source. In addition, the leak checking circuit 46A includes a conductive line 56 in electrical communication with the $V_{SS}$ pad $20V_{SS}$ on the die 12. Another conductive line 58 is in electrical communication with the $V_{DD}$ pad $20V_{DD}$ on the die 12. The leak checking circuit 46A also includes ammeters 60, 62 located in the electrical path of conductive lines 56 and 58 respectively. By applying a voltage to the input/output pad 20I/O of the die 12, any leakage current from the input/output pad 20I/O to the $V_{DD}$ pad $20V_{DD}$ or the $V_{SS}$ pad $20V_{SS}$ of the die 12 can be detected by the ammeters 60, 62. Furthermore, a sensing circuit 64 can be located in conductive line 54. The sensing circuit 64 can be used in place of or in conjunction with the ammeters 60, 62 to detect leakage from the input/output pad 20I/O to another pad or to the substrate or other component of the die 12. Using the sensing circuit 64, and upon application of a constant current by the power supply 52, any leakage current through the input/output pad 20I/O can be detected.

Figure 4A:
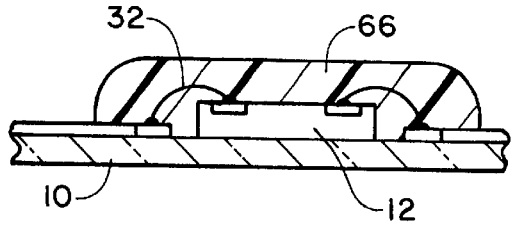
FIG. 4A is a cross sectional view equivalent to FIG. 4 following encapsulation of dice contained on the assembly.

Upon completion of the continuity and functionality tests, the assembly 22 can be transported to the next process station for further processing. As shown in FIG. 4A, further processing can include encapsulating the dice 12 and wires 32 in an encapsulant 66. For example, the encapsulant 66 can be applied directly to the dice 12 and substrate 10 in the form of a "glob top". Glob top encapsulation materials typically comprise electrically insulating polymers such as epoxies, silicones and polyimides. The encapsulant 66 can be formed by dispensing a required volume of viscous material over the dice 12, and portions of the substrate 10, and then curing the material. The encapsulant 66 can be formed over individual dice 12 and associated wires 32, or can be formed over groups of dice 12.

Following the encapsulation process, the dice 12 can be subjected to full functionality and parametric testing, to evaluate the electrical characteristics of the completed assembly 22 prior to use in an electronic device. Full functionality and parametric testing can be performed on individual dice or groups of dice. By way of example, the full functionality and parametric tests can include low and high Vcc margin tests, Vcc bump tests, speed verification tests, dynamic and static refresh tests, and a range of algorithms and data background tests to verify AC parameters. The full functionality and parametric tests can be performed with a conventional tester commercially available from Teradyne and others.

Figure 6:
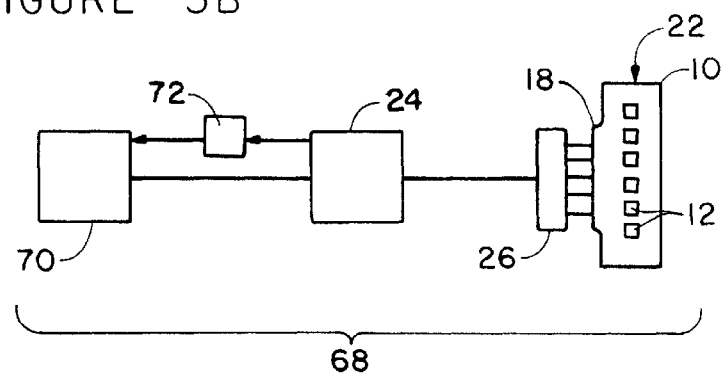
FIG. 6 is a schematic diagram of a system constructed in accordance with the invention.

Referring to FIG. 6, a system 68 adapted to perform the above outlined method is illustrated. The system 68 includes the tester 24 and the electrical connector 26. As previously described, the electrical connector 26 establishes electrical communication with the edge connector 18 on the substrate 10. The system 68 also includes a wire bonder apparatus 70 configured to form the bonded connections 34, 36 (FIG. 4). The wire bonder apparatus 70 can be a conventional wire bonder such as one manufactured by Kulicke and Soffa of Horsham, Pa. An exemplary wire bonder is a Kulicke and Soffa "MODEL 1488".

Preferably, the tester 24 is in close proximity to the wire bonder apparatus 70, and the electrical connector 26 is mounted within the wire bonder apparatus 70. This permits testing to be performed while the wire bonding process is in progress. Alternately, the electrical connector 26 can be located proximate to the wire bonder apparatus 70, such as at a separate test station. In this case, a conveyor or track can be configured to transport the wire bonded assembly 22 from the wire bonder apparatus 70 to the test station containing the tester 24 and electrical connector 26.

The system 68 can also include a controller 72, such as a computer or CPU, adapted to display and evaluate test data generated by the tester 24 during the test procedure. In addition, the controller 72 can be configured to operate the wire bonder apparatus 70, or to control transport of the assembly 22 as a function of the test data. For example, data can be compared by the controller to model data. Defective assemblies 22 can be identified and transported from the wire bonder apparatus 70 to a separate station for re-work. Assemblies 22 with no defects can be transported for further processing.

Thus the invention provides an improved method and system for fabricating and testing electronic assemblies that include wire bonded semiconductor dice. While the invention has been described with reference to certain preferred embodiments, as will be apparent to those skilled in the art, certain changes and modifications can be made without departing from the scope of the invention as defined by the following claims.

What is claimed is:

1. A system for fabricating and testing an electronic assembly comprising:

a substrate comprising a plurality of first pads;

a semiconductor die comprising a plurality of second pads and integrated circuits in electrical communication with the second pads;

a wire bonder configured to wire bond the first pads to the second pads to form wire bonded connections;

a tester configured to apply test signals to the integrated circuits; and an electrical connector mounted proximate to the wire bonder, the connector configured for electrical communication with the first pads during wire bonding of the first pads to the second pads, to permit the test signals to be applied through the wire bonded connections to the integrated circuits prior to further processing of the assembly.

2. The system of claim 1 further comprising a controller in electrical communication with the tester configured to receive test data from the tester and to control further processing of the assembly.

3. The system of claim 1 wherein the tester comprises a first circuit configured to evaluate electrical continuity in the wire bonded connections.

4. The system of claim 1 wherein the tester comprises a second circuit configured to evaluate a gross functionality of the die or assembly.

5. The system of claim 1 wherein the tester comprises a third circuit configured to detect cell defects in the integrated circuits.

6. The system of claim 1 wherein the tester comprises a fourth circuit configured to detect pad leakage in the second pads.

7. The system of claim 1 wherein the tester comprises a fifth circuit configured to detect opens and shorts in the wire bonded connections.

8. The system of claim 1 wherein the electrical connector comprises an electrical element selected from the group consisting of electrical sockets, electrical pins and spring loaded electrical connectors.

9. A system for fabricating and testing an electronic assembly comprising:
   a substrate comprising a plurality of first pads;
   a semiconductor die comprising a plurality of second pads and integrated circuits in electrical communication with the second pads;
   a wire bonder configured for wire bonding the first pads to the second pads to form wire bonded connections therebetween;
   an electrical connector mounted to the wire bonder, the connector configured to establish temporary electrical communication with the first pads; and
   an electrical circuit in electrical communication with the connector, the circuit configured to test electrical continuity between the first pads and the second pads and to apply test signals through the first pads and electrical connections to the second pads and integrated circuits.

10. The system of claim 9 wherein the tester is configured to evaluate a gross functionality of the die or assembly.

11. A system for fabricating and testing an electronic assembly comprising:
    a substrate comprising a plurality of first pads;
    a semiconductor die comprising a plurality of second pads and integrated circuits in electrical communication with the second pads;
    a wire bonder configured for wire bonding the first pads to the second pads to form wire bonded connections therebetween;
    an electrical connector mounted to the wire bonder, the connector configured to establish temporary electrical communication with the first pads; and
    an electrical circuit in electrical communication with the connector, the circuit configured to apply test signals through the first pads and wire bonded connections to the second pads and integrated circuits to test a gross functionality of the die or assembly.

12. The system of claim 11 wherein the test signals comprise a walking one test.

13. A system for fabricating and testing a multi chip module comprising:
    a wire bonder configured to wire bond first pads on a plurality of semiconductor dice to second pads on a substrate to form wire bonded connections therebetween;
    an electrical connector mounted proximate to the wire bonder, the connector configured to establish temporary electrical communication with the second pads;
    a tester in electrical communication with the connector, the tester configured to apply test signals through the wire bonded connections to test a across functionality of the dice or the module and to generate test data; and
    a controller configured to receive the test data from the tester and to control processing of the module following wire bonding responsive to the test data.

14. The system of claim 13 wherein the tester comprises a first circuit for testing electrical continuity in the wire bonded connections.

15. The system of claim 13 wherein the test signals comprise a walking one test.

16. The system of claim 13 wherein the tester comprises a third circuit for applying second test signals for testing for pad leakage from the first pads.

17. The system of claim 13 wherein the tester comprises a fourth circuit for testing for opens and shorts in the wire bonded connections.

18. The system of claim 13 wherein the tester comprises a fifth circuit for testing integrated circuits on the dice for cell defects.

* * * * *

UNITED STATES PATENT AND TRADEMARK OFFICE
CERTIFICATE OF CORRECTION

PATENT NO : 6,117,693
DATED : Sep. 12, 2000
INVENTOR(S): Rich Fogal; Steve Heppler It is certified that error appears in the above-identified patent and that said Letters Patent are hereby corrected as shown below:

In claim 13 @ column 8, line 27, change "across" to --gross--.

Signed and Sealed this

Twenty-fourth Day of April, 2001

Attest:

NICHOLAS P. GODICI

Attesting Officer     Acting Director of the United States Patent and Trademark Office